United States Patent
Chen

(10) Patent No.: US 7,309,660 B2
(45) Date of Patent: Dec. 18, 2007

(54) BUFFER LAYER FOR SELECTIVE SIGE GROWTH FOR UNIFORM NUCLEATION

(75) Inventor: Huajie Chen, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 10/943,048

(22) Filed: Sep. 16, 2004

(65) Prior Publication Data
US 2006/0057859 A1   Mar. 16, 2006

(51) Int. Cl.
H01L 21/31      (2006.01)
H01L 21/20      (2006.01)
H01L 21/36      (2006.01)

(52) U.S. Cl. .................. 438/765; 438/767; 438/507

(58) Field of Classification Search ................ 438/765, 438/767, 507
See application file for complete search history.

(56) References Cited

U.S. PATENT DOCUMENTS

| 5,630,905 | A | 5/1997 | Lynch et al. |
| 6,151,347 | A | 11/2000 | Noel et al. |
| 6,154,475 | A | 11/2000 | Soref et al. |
| 6,475,889 | B1 * | 11/2002 | Ring ........................... 438/571 |
| 6,621,131 | B2 | 9/2003 | Murthy et al. |
| 2002/0109135 | A1 | 8/2002 | Murota et al. |
| 2002/0168868 | A1 * | 11/2002 | Todd ........................... 438/767 |
| 2004/0150076 | A1 * | 8/2004 | Ramdani et al. ............ 257/632 |
| 2005/0153551 | A1 * | 7/2005 | Blomiley et al. ........... 438/689 |

OTHER PUBLICATIONS

Burgharz, J. N. et al., "Selective Epitaxial Base with Si/Ge Bandgap for Double-Poly Self-Aligned Bipolar Transistors," IBM Technical Disclosure Bulletin, vol. 34, No. 8, Jan. 1992, pp. 86-88.

* cited by examiner

*Primary Examiner*—Chuong A. Luu
(74) *Attorney, Agent, or Firm*—Todd M. C. Li; Hoffman, Warnick & D'Alessandro LLC

(57) ABSTRACT

Methods for preparing a surface for selective silicon-germanium epitaxy by forming a thin silicon (Si) buffer layer or a thin, low concentration SiGe buffer layer for uniform nucleation, are disclosed.

19 Claims, 2 Drawing Sheets

BUFFER LAYER FOR SELECTIVE SIGE GROWTH FOR UNIFORM NUCLEATION

BACKGROUND OF THE INVENTION

1. Technical Field

The present invention relates generally to selective epitaxial growth of silicon-germanium (SiGe), and more particularly, to methods and structure for providing a buffer layer for selective SiGe epitaxial growth to provide uniform nucleation.

2. Related Art

Selective silicon germanium (SiGe) epitaxial growth is used for SiGe raised source drain (RSD) or embedded SiGe structures because it allows for improved p-type field effect transistor (pFET) performance due to compressive strain in the channel and lower contact resistance. The compressive strain in the channel enhances the hole mobility.

One challenge relative to SiGe selective epitaxial growth is that it is very sensitive to surface conditions. The higher the germanium (Ge) concentration, the more sensitivity exists. In contrast, selective silicon (Si) epitaxial growth is less sensitive to the surface condition. SiGe selective epitaxial growth on highly doped substrates, e.g., $>1\times20/cm^3$, often leads to spotty growth or no growth where the highly doped substrate is exposed to ambient. In this case, a wet chemical clean and a hydrofluoric (HF) acid etch is necessary to remove the native oxide from the surface. Unfortunately, even with these cleanings steps, the highly doped surface reoxidizes easily, which causes a nucleation problem. Surfaces with residue from a spacer reactive ion etch (RIE) also cause spotty growth in selective SiGe epitaxial growth. In one example, where a 300 Angstrom (Å) thick layer of SiGe is desired, only 2 Å are possible for a highly doped (e.g., $\sim1\times20/cm^3$) P+ SOI layer, while for an undoped SOI layer, 314 Å of SiGe can be grown.

In view of the foregoing, there is a need in the art for a solution that solves the problems of the related art.

SUMMARY OF THE INVENTION

The invention includes methods for performing selective silicon-germanium epitaxy on a highly doped monocrystalline silicon by forming a thin silicon (Si) buffer layer or a thin, low concentration SiGe buffer layer for uniform nucleation.

A first aspect of the invention is directed to a method for performing selective silicon-germanium epitaxy on a highly doped monocrystalline silicon, the method comprising the steps of: providing a substrate including an exposed, highly doped, monocrystalline silicon region; etching surface oxide; selectively growing a buffer layer on the monocrystalline silicon region, the buffer layer including one of silicon and silicon-germanium; and selectively growing a silicon-germanium layer on the buffer layer.

A second aspect of the invention is directed to a method for performing selective silicon-germanium epitaxy on a highly doped monocrystalline silicon, the method comprising the steps of: providing a monocrystalline silicon region having a dopant concentration of greater than approximately $5\times10^{19}$ per cubic centimeter; etching surface oxide from the monocrystalline silicon region; selectively growing a buffer layer on the monocrystalline silicon region, the buffer layer having a thickness of no greater than approximately 200 Å; and selectively growing silicon-germanium with a germanium concentration of less than approximately 50%.

A third aspect of the invention is directed to a method for performing selective silicon-germanium epitaxy on a highly doped monocrystalline silicon, the method comprising the steps of: providing a monocrystalline silicon region having a dopant concentration of greater than approximately $5\times10^{19}$ per cubic centimeter; etching surface oxide from the monocrystalline silicon region; selectively growing a buffer layer on the monocrystalline silicon region, the buffer layer having a thickness of no greater than approximately 200 Å; and selectively growing silicon-germanium with a germanium concentration that is no less than approximately 10% and no greater than approximately 25% using a temperature of no less than approximately 500° C. and no greater than approximately 750°, and a source gas selected from the group consisting of: 1) dichlorosilane (DCS), hydrochloride (HCl) and germane ($GeH_4$), 2) silane ($SiH_4$), germane ($GeH_4$) and hydrochloride (HCl); 3) disilane ($Si_2H_6$), germane ($GeH_4$) and hydrochloride (HCl); and 4) $Si_2H_6$, germane ($GeH_4$) and chlorine ($Cl_2$).

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Selective silicon germanium (SiGe) epitaxial growth is used for SiGe raised source drain (RSD) or embedded SiGe structures because it allows for improved p-type field effect transistor (pFET) performance due to compressive strain in the channel and lower contact resistance of silicide. The compressive strain in the channel enhances the hole mobility. SiGe RSD on NFET also lowers silicide contact resistance.

Figure 1:
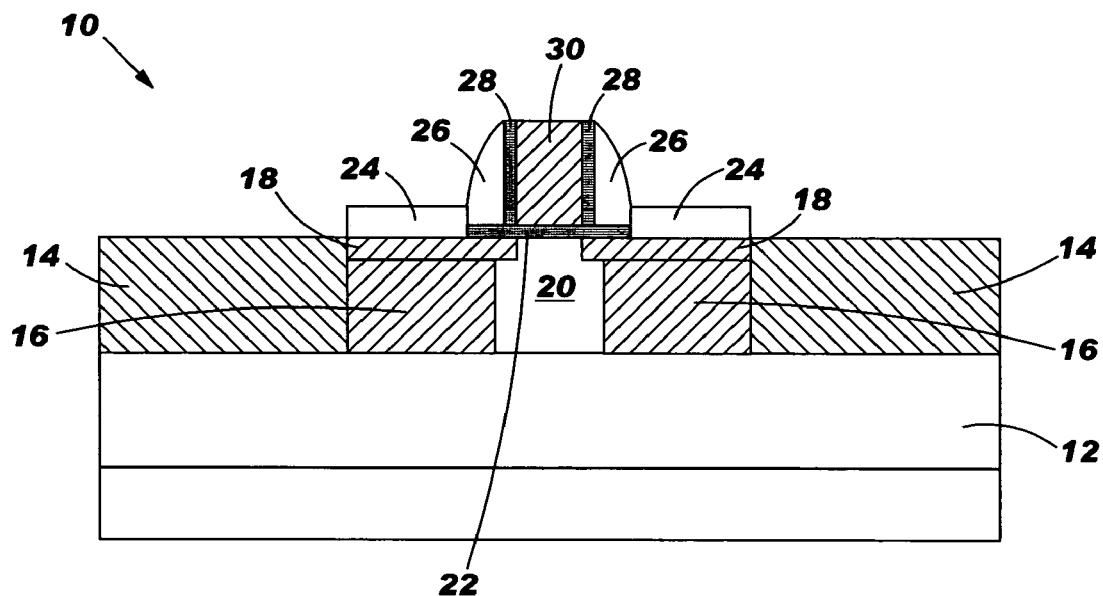
FIG. 1 shows a transistor including a silicon-germanium raised source/drain.
Figure 2:
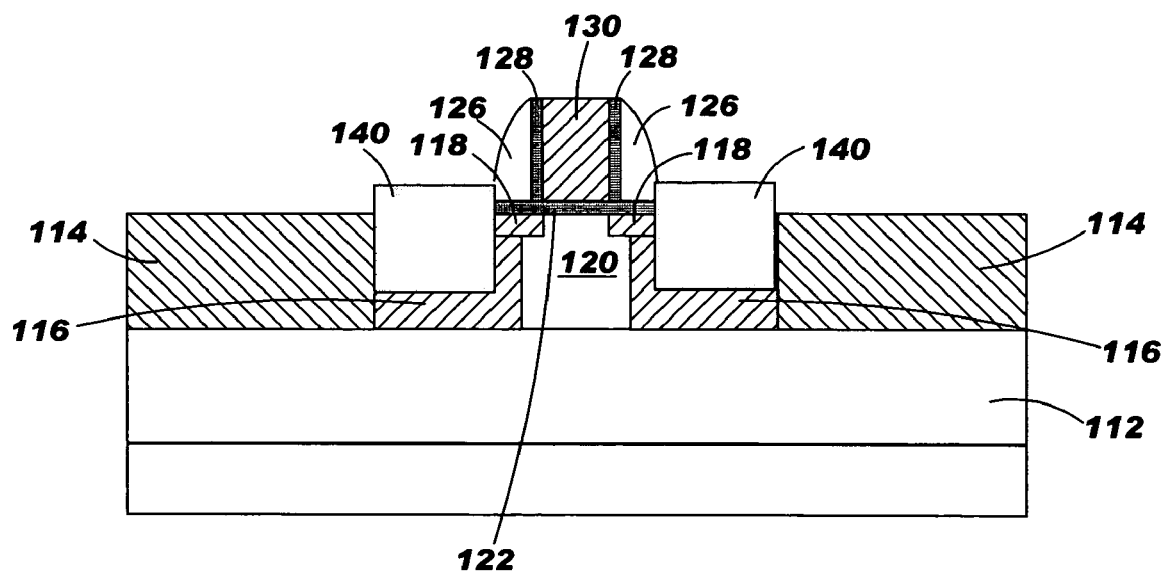
FIG. 2 shows a transistor with embedded silicon-germanium in the source/drain region.

With reference to the accompanying drawings, FIG. 1 illustrates a transistor 10 with a SiGe raised source drain (RSD). Transistor 10 includes: a buried oxide 12, a shallow trench isolation (STI) 14, a source/drain region 16, an extension region 18, a well 20 having a gate oxide 22 thereabove, a SiGe raised source/drain region 24, a spacer 26, a reoxidation area 28, and a gate 30. FIG. 2 illustrates a transistor 110 with an embedded SiGe source/drain including: a buried oxide 112, a shallow trench isolation (STI) 114, a source/drain region 116, an extension region 118, a well 120 having a gate oxide 122 thereabove, a spacer 126, a reoxidation area 128, and a gate 130. Transistor 110 also includes a unitary, embedded silicon-germanium (SiGe) source/drain region 140. In these cases, the exposed substrate for selective SiGe epitaxy is highly doped, e.g., having $>1\times20/cm^3$ of dopant. Although transistors built on a silicon-on-insulator (SOI) substrate are illustrated here, the invention can also be applied to a bulk substrate.

One challenge relative to SiGe selective epitaxial growth is that it is very sensitive to surface conditions. The higher the germanium (Ge) concentration, the more sensitivity exists. In contrast, selective silicon (Si) epitaxial growth is less sensitive to the surface condition. SiGe selective epitaxial growth on highly doped substrates, e.g., >1×20/cm$^3$, often leads to spotty growth or no growth where the highly doped substrate is exposed to ambient. In this case, a wet chemical clean and a hydrofluoric (HF) acid etch is necessary to remove the native oxide from the surface. Unfortunately, even with these cleanings steps, the highly doped surface reoxidizes easily, which causes a nucleation problem. This invention utilizes the fact that selective Si epitaxy is less sensitive to the surface condition to improve nucleation of selective SiGe epitaxy.

Figure 3:
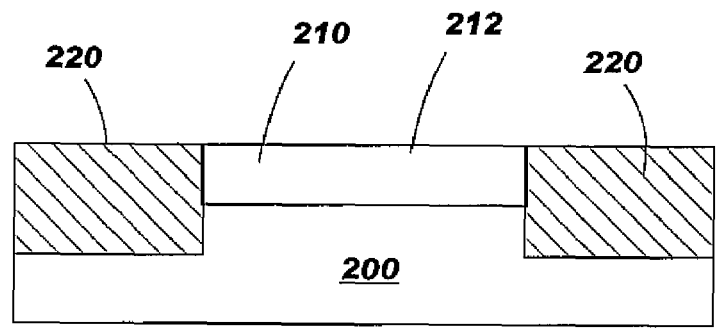
FIGS. 3-5 show steps of methods of forming the silicon-germanium layer according to the invention.
Figure 4:
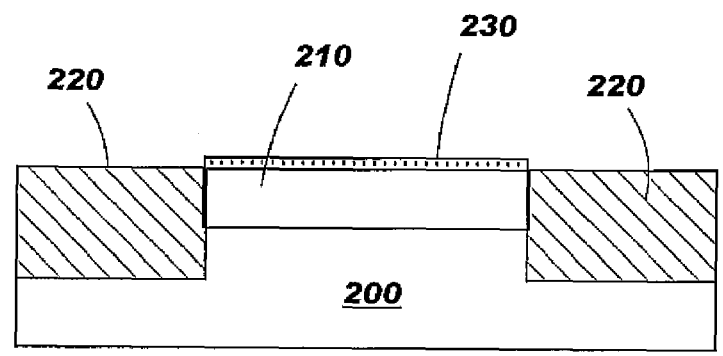
Figure 5:
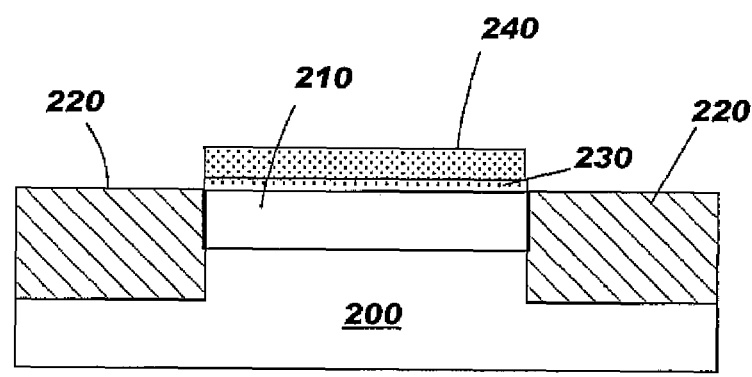

Referring to FIGS. 3-5, one embodiment of a method for performing a selective silicon-germanium epitaxy on a highly doped monocrystalline silicon will now be described. A simpler structure is described here. As shown in FIG. 3, in a first step, a substrate 200 including an exposed, highly doped, monocrystalline silicon region 210 is provided. Highly doped silicon region 210 may be an extension region, a source/drain region, or a recessed source/drain region. In any event, silicon region 210 is doped to greater than approximately 5×10$^{19}$ per cubic centimeter. Substrate 200 also includes a dielectric region 220, which may be STI or a dielectric spacer.

A hydrofluoric acid (HF) etch process is used first to remove most of the oxide on a surface 212 of highly doped silicon region 210. A diluted HF solution is typically used for this etching process, such as typically 10:1-500:1H$_2$O: HF solution, preferably 50:1-200:1 HF solution. Cleaning processes that remove particles, metals, organic contaminations can be performed before the HF etch. After the HF etch, the wafer is dried without water rinse (HF last), or it can be rinsed with diluted HCl solution (HCl last), or de-ionized (DI) water before drying. A HF last or HCl last process is preferred as it minimizes the reoxidation of the silicon surface. Silicon surface 212 after this HF etch is passivated with hydrogen, which slows down the reoxidation during the time the wafer is exposed to an oxygen-containing environment, such as when it is transferred from the HF etch chamber to the epitaxy chamber.

Substrate 200 is then transferred and loaded into an epitaxy loadlock chamber (not shown) within a time window. The time window can be as long as a few hours before silicon surface 212 starts to be reoxidized significantly in the ambient. A time window of less than 1 hour is preferred to minimize reoxidation. The loadlock chamber of the epitaxy tool is purged with high-purity inert gas, such as high-purity nitrogen. A loadlock chamber that is capable of having the ambient evacuated (pumped loadlock) is preferred as it can quickly reduce the oxygen and moisture content in the loadlock to below the parts-per-million (ppm) level during a purge cycle. The wafers can then be transferred to the epitaxy deposition chamber.

Referring to FIG. 4, a next step includes selectively growing a buffer (or nucleation) layer 230 on monocrystalline silicon region 210, which is shown much larger in FIG. 4 than actual size so as to be easily discernable. In particular, buffer layer 230 preferably has a thickness of no greater than approximately 200 Å, and even more preferably of no greater than approximately 50 Å. Buffer layer 230 includes silicon or silicon-germanium. In one embodiment, buffer layer 230 is grown using a temperature of no less than approximately 550° C. and no greater than approximately 850° C., and more preferably using a temperature of no less than approximately 600° C. and no greater than approximately 750° C. A source gas may be selected from: 1) dichlorosilane (DCS) and hydrochloride (HCl) as a source gas, and 2) silane (SiH$_4$) and hydrochloride (HCl). High purity hydrogen (H$_2$) gas is typically used as a carrier gas. When buffer layer 230 includes silicon-germanium, a germanium concentration of the layer is preferably no greater than approximately 25%, and even more preferably no greater than 10%. In any event, the germanium concentration of buffer layer 230 is less than the silicon-germanium layer to be formed next.

In a next step, shown in FIG. 5, a silicon-germanium (SiGe) layer 240 is formed on buffer layer 230. SiGe layer 240 is formed by conducting an epitaxial selective growth of SiGe. The growing step may include using a temperature of no less than approximately 500° C. and no greater than approximately 7500. A source gas may be selected from: 1) DCS, hydrochloride (HCl) and germane (GeH$_4$), 2) silane (SiH$_4$), germane (GeH$_4$) and hydrochloride (HCl); 3) disilane (Si$_2$H$_6$), germane (GeH$_4$) and hydrochloride (HCl); and 4) Si$_2$H$_6$, germane (GeH$_4$) and chlorine (Cl$_2$). High purity hydrogen (H$_2$) gas is typically used as carrier gas. Furthermore, in this embodiment, a germanium concentration is preferably no greater than approximately 50%, and more preferably is no less than approximately 10% and no greater than approximately 25%. In another embodiment, SiGe may be grown in intervals having increasing concentrations of germanium, e.g., Si, then SiGe with 5% Ge, then SiGe with 10% Ge, then SiGe with 15% Ge, etc.

Buffer layer 230 and SiGe layer 240 are intrinsic as described above. They can be in-situ doped as well. In the case of in-situ doping, a dopant source gas is added to above mentioned source gases. B$_2$H$_6$ is typically used as source gas for P-type doping, and AsH$_3$ or PH$_3$ is typically used for N-type doping.

While this invention has-been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for performing selective silicon-germanium epitaxy on a highly doped monocrystalline silicon, the method comprising:
   providing an exposed, highly doped, monocrystalline silicon region within a substrate, the monocrystaline silcon region having a dopant concentration of greater than approximately 5×10$^{19}$ per cubic centimeter;
   etching surface oxide;
   selectively growing a buffer layer directly on the monocrystalline silicon region, the buffer layer including one of silicon and silicon-germanium; and
   selectively growing a silicon-germanium layer on the buffer layer.

2. The method of claim 1, wherein the monocrystalline silicon region includes one of: an extension region, a source/drain region and a recessed source/drain region.

3. The method of claim 1, wherein the buffer layer has a thickness of no greater than approximately 200 Å.

4. The method of claim 3, wherein the buffer layer has a thickness of no greater than approximately 50 Å.

5. The method of claim 1, wherein the buffer layer growing includes using a temperature of no less than approximately 550° C. and no greater than approximately 850° C.

6. The method of claim 5, wherein the temperature is no less than approximately 600° C. and no greater than approximately 750° C.

7. The method of claim 1, wherein in the case that the buffer layer is silicon, the growing includes using a source gas selected from the group consisting of: 1) dichlorosilane (DCS) and hydrochloride (HCl) as a source gas, and 2) silane ($SiH_4$) and hydrochloride (HCl).

8. The method of claim 1, wherein in the case that the buffer layer includes silicon-germanium, a germanium concentration of the buffer layer is no greater than approximately 25% and is less than the silicon-germanium layer.

9. The method of claim 8, wherein the germanium concentration of the buffer layer is no greater than 10%.

10. The method of claim 1, wherein the silicon-germanium growing includes using a temperature of no less than approximately 500° C. and no greater than approximately 750°.

11. The method of claim 1, wherein the silicon-germanium growing includes using a source gas selected from the group consisting of: 1) DCS, hydrochloride (HCl) and germane ($GeH_4$), 2) silane ($SiH_4$), germane ($GeH_4$) and hydrochloride (HCl); 3) $Si_2H_6$, germane ($GeH_4$) and hydrochloride (HCl); and 4) $Si_2H_6$, germane ($GeH_4$) and chlorine ($Cl_2$).

12. The method of claim 1, wherein in the silicon-germanium growing includes using a germanium concentration that is no greater than approximately 50%.

13. The method of claim 12, wherein the germanium concentration is no less than approximately 10% and no greater than approximately 25%.

14. The method of claim 1, wherein the silicon-germanium growing includes growing silicon-germanium using intervals having increasing concentrations of germanium.

15. The method of claim 1, wherein the buffer layer and silicon germanium layer are in-situ doped using one of:
$B_2H_6$ as a source gas for P-type doping; and
$AsH_3$ or $PH_3$ as a source gas for N-type doping.

16. The method in claim 1, wherein the surface oxide etching step includes using a hydrofluoric acid etch.

17. The method in claim 16, where the hydrofluoric acid includes a $H_2O$:HF solution with a ratio of 10:1 to 500:1.

18. A method for performing selective silicon-germanium epitaxy on a highly doped monocrystalline silicon, the method comprising:
providing a monocrystalline silicon region within a substrate having a dopant concentration of greater than approximately $5 \times 10^{19}$ per cubic centimeter;
etching surface oxide from the monocrystalline silicon region;
selectively growing a buffer layer directly on the monocrystalline silicon region, the buffer layer having a thickness of no greater than approximately 200 Å; and
selectively growing silicon-germanium with a germanium concentration of less than approximately 50%.

19. A method for performing selective silicon-germanium epitaxy on a highly doped monocrystalline silicon, the method comprising:
providing a monocrystalline silicon region within a substrate having a dopant concentration of greater than approximately $5 \times 10^{19}$ per cubic centimeter;
etching surface oxide from the monocrystalline silicon region;
selectively growing a buffer layer directly on the monocrystalline silicon region, the buffer layer having a thickness of no greater than approximately 200 Å; and
selectively growing silicon-germanium with a germanium concentration that is no less than approximately 10% and no greater than approximately 25% using a temperature of no less than approximately 500° C. and no greater than approximately 750°, and a source gas selected from the group consisting of: 1) dichlorosilane (DCS), hydrochloride (HCl) and germane ($GeH_4$), 2) silane ($SiH_4$, germane ($GeH_4$) and hydrochloride (HCl); 3) disilane ($Si_2H_6$), germane ($GeH_4$) and hydrochloride (HCl); and 4) $Si_2H_6$, germane ($GeH_4$) and chlorine ($Cl_2$).

* * * * *